(12) United States Patent
Song

(10) Patent No.: US 11,145,836 B2
(45) Date of Patent: Oct. 12, 2021

(54) OLED DISPLAY DEVICE AND MANUFACTURING METHOD FOR THE SAME

(71) Applicant: SHENZHEN CHINA STAR OPTOELECTRONICS TECHNOLOGY CO., LTD., Guangdong (CN)

(72) Inventor: Jiangjiang Song, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 555 days.

(21) Appl. No.: 16/071,511

(22) PCT Filed: May 22, 2018

(86) PCT No.: PCT/CN2018/087785
§ 371 (c)(1),
(2) Date: Jul. 20, 2018

(87) PCT Pub. No.: WO2019/192060
PCT Pub. Date: Oct. 10, 2019

(65) Prior Publication Data
US 2021/0091326 A1 Mar. 25, 2021

(30) Foreign Application Priority Data
Apr. 4, 2018 (CN) .......................... 201810297285.8

(51) Int. Cl.
*H01L 29/08* (2006.01)
*H01L 51/50* (2006.01)
(Continued)

(52) U.S. Cl.
CPC .......... *H01L 51/504* (2013.01); *H01L 27/322* (2013.01); *H01L 51/5253* (2013.01); *H01L 51/56* (2013.01); *H01L 2227/323* (2013.01)

(58) Field of Classification Search
CPC . H01L 51/56; H01L 51/5218; H01L 51/5253; H01L 51/504; H01L 27/3244
See application file for complete search history.

(56) References Cited

U.S. PATENT DOCUMENTS

| 2009/0053559 A1* | 2/2009 | Spindler | ................ | C09K 11/06 |
| | | | | 428/704 |
| 2010/0232162 A1* | 9/2010 | Shin | .................... | H01L 51/5284 |
| | | | | 362/293 |

(Continued)

FOREIGN PATENT DOCUMENTS

| CN | 105161514 A | 12/2015 |
| CN | 106784372 A | 5/2017 |

(Continued)

*Primary Examiner* — Phuc T Dang
(74) *Attorney, Agent, or Firm* — Leong C. Lei

(57) ABSTRACT

An OLED display device and a manufacturing method for the same are provided. The OLED display device includes a substrate, an organic light-emitting layer, a first encapsulation layer, a color filter layer, and a second encapsulation layer. Wherein the organic light-emitting layer is disposed on the substrate, the first encapsulation layer covers a surface of the organic light-emitting layer, the color filter layer is disposed on the first encapsulation layer, and the second encapsulation layer covers a surface of the color filter layer. In the present invention, the first encapsulation layer functions as a substrate of the color filter layer and is encapsulated by the first encapsulation layer and the second encapsulation layer, so that the CF substrate is omitted, the thickness of the entire display device is reduced, and flexibility is achieved.

12 Claims, 5 Drawing Sheets

(51) Int. Cl.
  *H01L 27/32* (2006.01)
  *H01L 51/52* (2006.01)
  *H01L 51/56* (2006.01)

(56) References Cited

U.S. PATENT DOCUMENTS

| | | | |
|---|---|---|---|
| 2012/0168796 A1 | 7/2012 | Moon et al. | |
| 2013/0221410 A1* | 8/2013 | Ahn | H01L 27/14629 257/225 |
| 2014/0361261 A1* | 12/2014 | Choi | H01L 51/5218 257/40 |
| 2015/0144909 A1* | 5/2015 | Byun | H01L 51/5253 257/40 |
| 2016/0163769 A1* | 6/2016 | Lee | H01L 27/3246 257/40 |
| 2017/0194380 A1* | 7/2017 | Fujino | H01L 27/322 |
| 2018/0061894 A1* | 3/2018 | Kim | H01L 51/5268 |
| 2018/0151628 A1* | 5/2018 | Park | H01L 27/3206 |
| 2018/0182814 A1* | 6/2018 | Kim | H01L 27/322 |
| 2018/0182819 A1* | 6/2018 | Jo | G06F 3/0412 |
| 2018/0301515 A1* | 10/2018 | Huang | G06F 3/0445 |
| 2018/0321536 A1* | 11/2018 | Hu | G02F 1/133514 |

FOREIGN PATENT DOCUMENTS

| | | |
|---|---|---|
| CN | 107768401 A | 3/2018 |
| JP | 2004362920 A | 12/2004 |

* cited by examiner

OLED DISPLAY DEVICE AND MANUFACTURING METHOD FOR THE SAME

RELATED APPLICATIONS

The present application is a National Phase of International Application Number PCT/CN2018/087785, filed May 22, 2018, and claims the priority of China Application No. 201810297285.8, filed Apr. 4, 2018.

FIELD OF THE INVENTION

The invention relates to a curved display technical field, and more particularly to an OLED display device and a manufacturing method for the same.

BACKGROUND OF THE INVENTION

A light emitted by a light-emitting layer of a white OLED is white light, that is, WOLED, and then after passing through a Color Filter (CF) to achieve colorization so that the lifetimes of the three primary colors of R, G, and B in the OLED are different such that the problem of color distortion is generated can be avoided. The white light OLED is easy to make a high-resolution panel, which has a great potential in the large-size panel. In the conventional WOLED panel, two layers of substrates are generally required, which are a TFT substrate and a CF substrate, and the structure is complicated. The two-layer substrate will greatly increase the thickness of the entire panel and cannot achieve a flexible display.

SUMMARY OF THE INVENTION

In order to solve the deficiencies of the prior art, the present invention provides an OLED display device and a method for manufacturing the same, which can reduce the thickness of the entire panel and enable flexible display.

The specific technology solution provided by the present invention is: an OLED display device, comprising: a substrate, an organic light-emitting layer, a first encapsulation layer, a color filter layer, and a second encapsulation layer; wherein the organic light-emitting layer is disposed on the substrate, the first encapsulation layer covers a surface of the organic light-emitting layer, the color filter layer is disposed on the first encapsulation layer, and the second encapsulation layer covers a surface of the color filter layer.

Furthermore, the first encapsulation layer includes a first barrier layer, and a material of the first barrier layer is an inorganic material.

Furthermore, the first encapsulation layer further includes a first buffer layer, a material of the first buffer layer is an organic material, the first barrier layer and the first buffer layer are alternately stacked, and the first barrier layer and the first buffer layer are alternately stacked, and the first buffer layer is clamped between two adjacent first barrier layers.

Furthermore, a projection of the organic light-emitting layer on the first barrier layer is located within a projection of the first buffer layer on the first barrier layer.

Furthermore, the second encapsulation layer includes a second barrier layer, and a material of the second barrier layer is an inorganic material.

Furthermore, the second encapsulation layer 5 further includes a second buffer layer, a material of the second buffer layer is an organic material, the second barrier layer and the second buffer layer are alternately stacked, and the second buffer layer is clamped between each adjacent two second barrier layers.

Furthermore, the organic light-emitting layer includes a first electrode, a hole transport layer, a first light-emitting layer, a second light-emitting layer, a third light-emitting layer, an electron transport layer, and a second electrode which are sequentially stacked away from the substrate.

Furthermore, the color filter layer includes multiple photoresist units arranged as matrix, and each of the photoresist units includes a red photoresist, a green photoresist, and a blue photoresist.

The present invention also provides a manufacturing method for an OLED display device, comprising steps of: providing a substrate; forming an organic light-emitting layer on the substrate; depositing a first encapsulation layer on an exposed region of the substrate and the organic light-emitting layer; forming a color filter layer on a surface of the first encapsulation layer; and depositing a second encapsulation layer on an exposed region of the color filter layer.

Furthermore, the step of forming a color filter layer on a surface of the first encapsulation layer comprises steps of: coating a filter material on a surface of the first encapsulation layer; and exposing the filter material with a mask plate to obtain the color filter layer.

The OLED display device provided by the present invention includes a substrate, an organic light-emitting layer, a first encapsulation layer, a color filter layer, and a second encapsulation layer. The organic light-emitting layer is disposed on the substrate, and the first encapsulation layer covers a surface of the organic light-emitting layer, the color filter layer is disposed on the first encapsulation layer, and the second encapsulation layer covers a surface of the color filter layer, and the first encapsulation layer functions as a substrate of the color filter layer and is encapsulated by the first encapsulation layer and the second encapsulation layer, so that the CF substrate is omitted, the thickness of the entire display device is reduced, and flexibility is achieved.

DETAILED DESCRIPTION OF PREFERRED EMBODIMENTS

Figure 1:
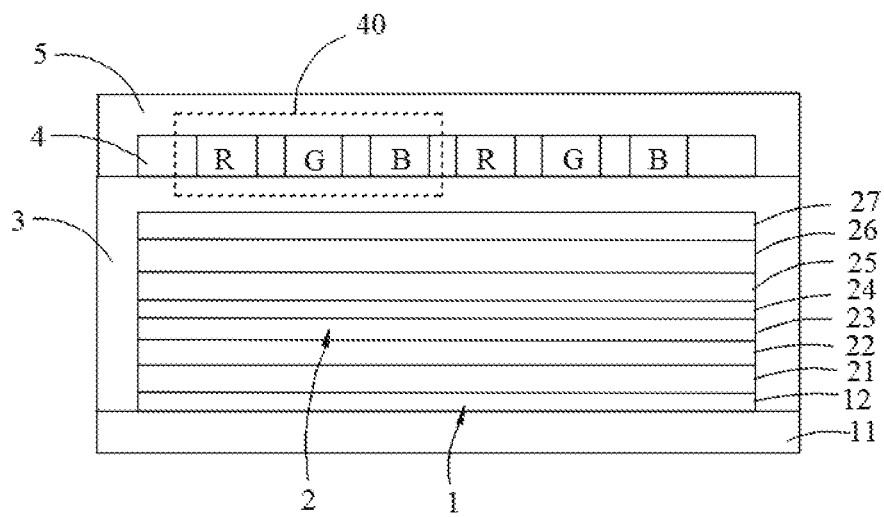
FIG. 1 is a schematic structural diagram of an OLED display device according to the embodiment of the present invention.

Hereinafter, embodiments of the present invention will be described in detail with reference to the accompanying drawings. However, the present invention may be embodied in many different forms and the present invention should not be construed as limited to the specific embodiments set forth herein. On the contrary, these embodiments are provided so as to explain the principles of the invention and their practical application, to thereby enable others skilled in the art to understand the various embodiments of the present invention and various modifications that are suited to the particular use contemplated. In the drawings, a same reference numeral will be used to refer to a same element throughout.

With reference to FIG. 1, the OLED display device provided in this embodiment includes a substrate 1, an organic light-emitting layer 2, a first encapsulation layer 3, a color filter layer 4, and a second encapsulation layer 5. The organic light-emitting layer 2 is disposed on the substrate 1. The first encapsulation layer 3 covers a surface of the organic light-emitting layer 2, the color filter layer 4 is disposed on the first encapsulation layer 3, and the second encapsulation layer 5 covers a surface of the color filter layer 4.

The substrate 1 is a TFT array substrate. The substrate 1 includes a bottom plate 11 and a TFT array 12 formed on a surface of the bottom plate 11. The organic light-emitting layer 2 is disposed on the TFT array 12. Each of the first encapsulation layer 3 and the second encapsulation layer 5 is made of a transparent material and having a certain flexibility. The color filter layer 4 is sandwiched between the first encapsulation layer 3 and the second encapsulation layer 5. A light emitted from the organic light-emitting layer 2 is a white light, and after the white light emitted from the organic light-emitting layer 2 passing through the color filter layer 4, a color light is formed.

Preferably, a thickness of the first encapsulation layer 3 is 500~1000 nm, and a thickness of the second encapsulation layer 5 is also 500~1000 nm.

The organic light-emitting layer 2 includes a first electrode 21, a hole transport layer 22, a first light-emitting layer 23, a second light-emitting layer 24, a third light-emitting layer 25, an electron transport layer 26, and a second electrode 27 which are sequentially stacked away from the TFT array 12. The first light-emitting layer 23, the second light-emitting layer 24, and the third light-emitting layer 25 respectively emit a red, a green, and a blue light. The three lights are mixed to form a white light. The organic light-emitting layer 2 has multiple pixel units arranged as a matrix. Each pixel unit includes a red sub-pixel, a green sub-pixel, and a blue sub-pixel.

The color filter layer 4 includes multiple photoresist units 40 arranged as matrix. Each of the photoresist units 40 includes a red photoresist R, a green photoresist G, and a blue photoresist B. Each photoresist unit 40 corresponds to one pixel unit. The red photoresist R, the green photoresist G, the blue photoresist B in the photoresist unit 40 correspond to the red sub-pixel, the green sub-pixel, and the blue sub-pixel in the pixel unit in a one-to-one manner.

Figure 2:
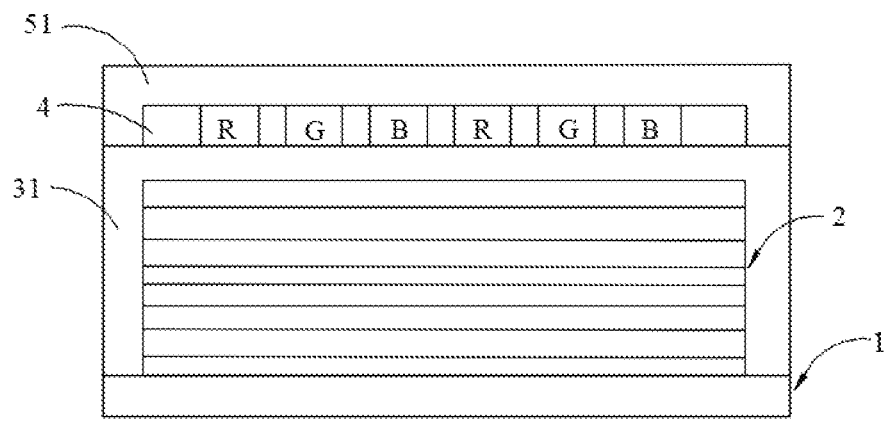
FIG. 2 is a schematic structural diagram of an OLED display device in a first embodiment.

With reference to FIG. 2, in the first embodiment of the present embodiment, the first encapsulation layer 3 includes a first barrier layer 31. That is, the first encapsulation layer 3 only formed by one layer of the first barrier layer 31, and the material of the first barrier layer 31 is an inorganic material such as SiNx, but the material of the first barrier layer 31 is not limited thereto. Because the inorganic material can block water and oxygen well so that the water vapor and oxygen can be prevented from entering the organic light-emitting layer 2. The second encapsulation layer 5 includes a second barrier layer 51. That is, the second encapsulation layer 5 is only formed by one layer of the second barrier layer 51. The material of the second barrier layer 51 is an inorganic material, for example, SiNx, but the material of the second barrier layer 51 is not limited. Because the material of the color filter layer 4 is also generally an organic material, the inorganic material can block water and oxygen well, thereby preventing the water vapor and oxygen from entering the color filter layer 4.

Figure 3:
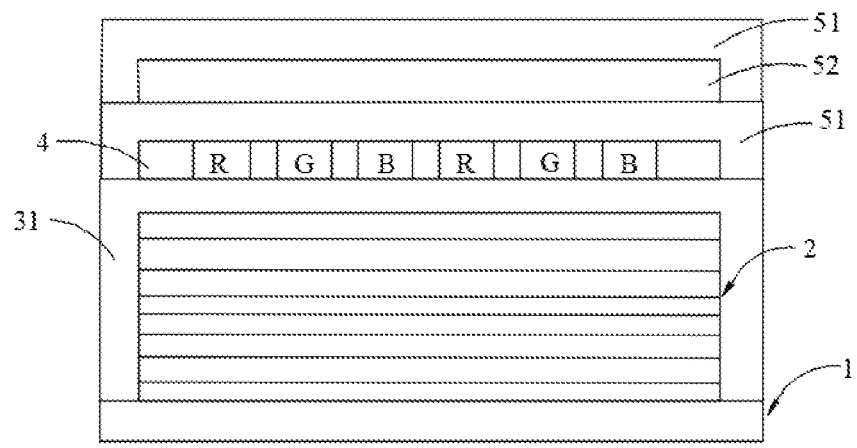
FIG. 3 is a schematic structural diagram of an OLED display device in a second embodiment.

With reference to FIG. 3, in a second embodiment of the present embodiment, the first encapsulation layer 3 includes a first barrier layer 31. That is, the first encapsulation layer 3 is only formed by one layer of the first barrier layer 31. The material of the first barrier layer 31 is an inorganic material such as SiNx, but the material of the first barrier layer 31 is not limited thereto.

The second encapsulation layer 5 includes a second barrier layer 51 and a second buffer layer 52. The second barrier layer 51 and the second buffer layer 52 are alternately stacked, and one layer of the second buffer layer 52 is disposed between each adjacent two second barrier layers 51. That is, the second encapsulation layer 5 includes at least two second barrier layers 51 and one second buffer layer 52. The topmost layer and the bottommost layer of the second encapsulation layer 5 are both the second barrier layers 51. The material of the second barrier layer 51 is an inorganic material, for example, SiNx, but the material of the second barrier layer 51 is not limited thereto. The material of the second buffer layer 52 is an organic material, for example, SiCN or SiOC, but the material of the second buffer layer 52 is not limited thereto. FIG. 3 only shows that the second encapsulation layer 5 includes two second barrier layers 51 and one second buffer layer 52, which is shown by way of example only and is not limited.

Preferably, a projection of the color filter layer 4 on the second barrier layer 51 is located within a projection of the second buffer layer 52 on the second barrier layer 51. In this way, the second buffer layer 52 can completely cover the color filter layer 4.

In the second embodiment of the present embodiment, the second encapsulation layer 5 includes the second barrier layer 51 and the second buffer layer 52 that are alternately stacked, thereby further increasing the encapsulation effect of the OLED display device.

Figure 4:
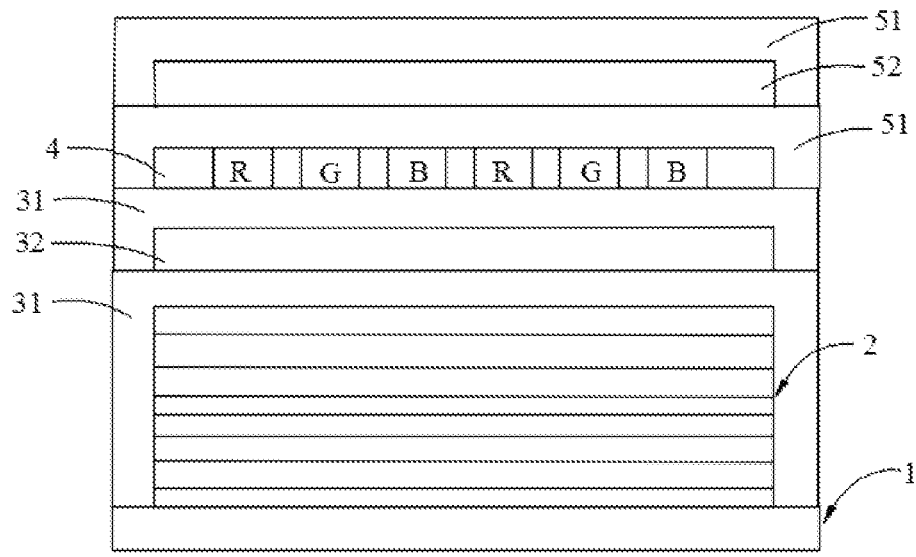
FIG. 4 is a schematic structural diagram of an OLED display device in a third embodiment.
Figure 5A:
FIG. 5a to FIG. 5h are flowcharts of a manufacturing method for an OLED display device according to the present embodiment.
Figure 5B:
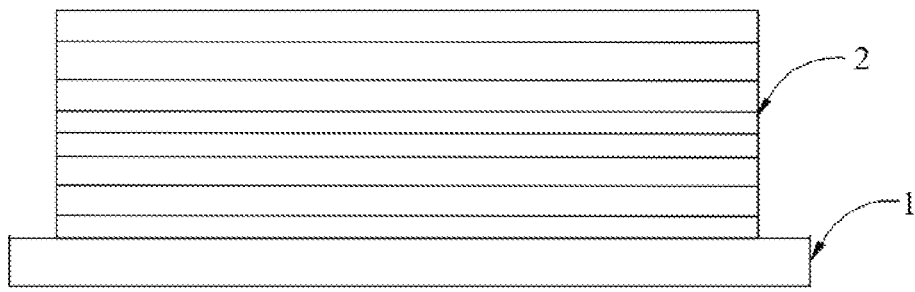
Figure 5C:
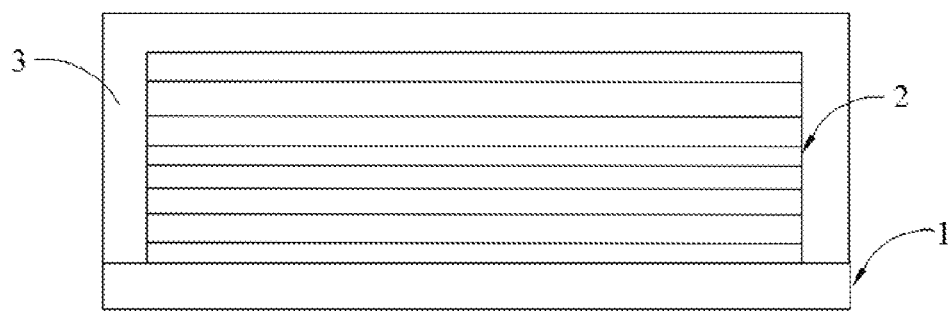
Figure 5D:
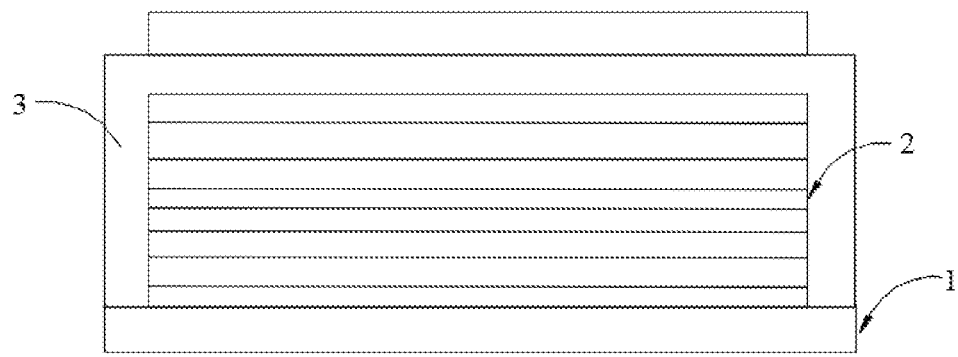
Figure 5E:
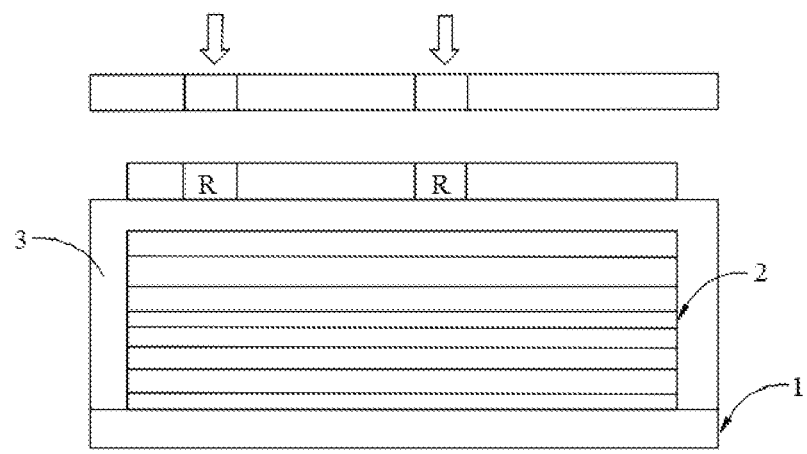
Figure 5F:
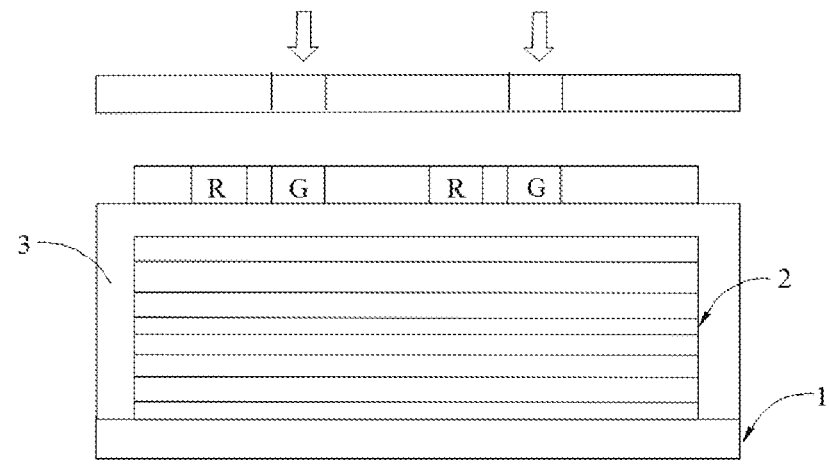
Figure 5G:
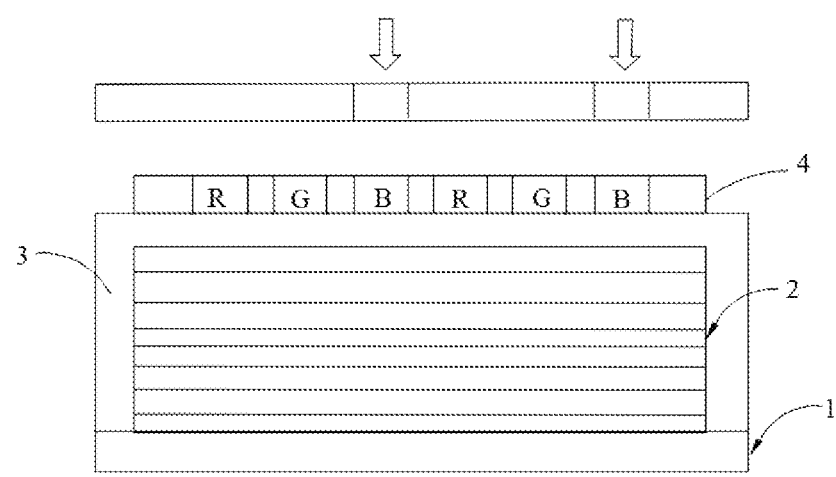
Figure 5H:
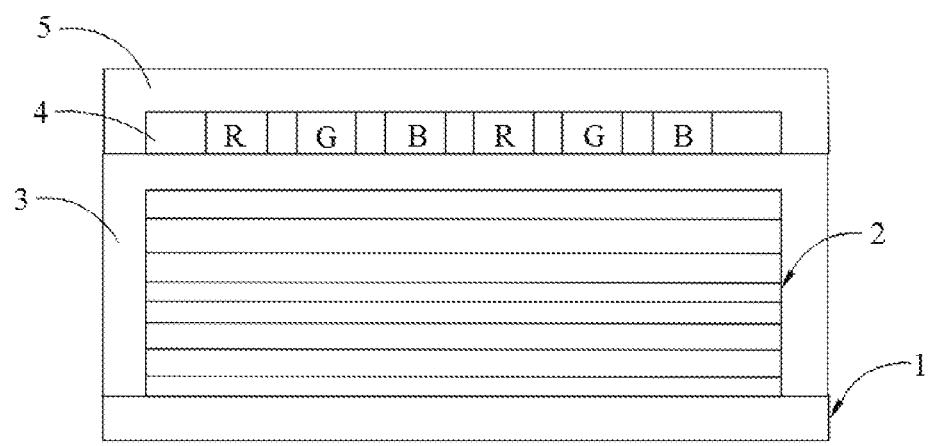

With reference to FIG. 4, in the third embodiment of the present embodiment, the first encapsulation layer 3 includes a first barrier layer 31 and a first buffer layer 32, and the first barrier layer 31 and the first buffer layer 32 are alternately stacked. The first buffer layer 32 is clamped between two adjacent first barrier layers 31. That is, the first encapsulation layer 3 at least includes two first barrier layers 31 and one first buffer layer 32. Both the topmost layer and the bottommost layer of the first encapsulation layer 3 are the first barrier layers 31. The material of the first barrier layer 31 is an inorganic material, for example, SiNx, but the material of the first barrier layer 31 is not limited thereto. The material of the first buffer layer 32 is an organic material, for example, SiCN or SiOC, but the material of the first buffer layer 32 is not limited thereto. FIG. 4 merely shows the situation where the first encapsulation layer 3 includes two first barrier layers 31 and one first buffer layer 32, which is shown by way of example only and is not for limiting.

Preferably, a projection of the organic light-emitting layer 2 on the first barrier layer 31 is located within a projection of the first buffer layer 32 on the first barrier layer 31. Accordingly, the first buffer layer 32 can completely cover the organic light-emitting layer 2.

The second encapsulation layer 5 includes a second barrier layer 51 and a second buffer layer 52. The second barrier layer 51 and the second buffer layer 52 are alternately stacked, and the second buffer layer 52 is clamped between each adjacent two second barrier layers 51. That is, the second encapsulation layer 5 includes at least two second barrier layers 51 and one second buffer layer 52. The topmost layer and the bottommost layer of the second encapsulation layer 5 are both second barrier layers 51. The material of the second barrier layer 51 is an inorganic material, for example, SiNx, but the material of the second barrier layer 51 is not limited thereto. The material of the second buffer layer 52 is an organic material, for example, SiCN or SiOC, but the material of the second buffer layer 52 is not limited thereto. FIG. 4 merely shows the situation that the second encapsulation layer 5 includes two second barrier layers 51 and one second buffer layer 52, which is shown by way of example only and is not for limiting.

Preferably, a projection of the color filter layer 4 on the second barrier layer 51 is located within a projection of the second buffer layer 52 on the second barrier layer 51. In this way, the second buffer layer 52 can completely cover the color filter layer 4.

In the third embodiment of the present embodiment, the first encapsulation layer 3 includes the first barrier layer 31 and the first buffer layer 32 that are alternately stacked, and the second encapsulation layer 5 includes the second barrier layer 51 and the second buffer layer 52 that are alternately stacked in order to further increase the packaging effect of the OLED display device.

With reference to FIG. 5a to FIG. 5h, the present embodiment further provides a manufacturing method for the above OLED display device. The method includes the following steps:

S1, providing a substrate 1;

S2, forming an organic light-emitting layer 2 on the substrate 1;

S3: depositing a first encapsulation layer 3 on an exposed region of the substrate 1 and the organic light-emitting layer 2. The first encapsulation layer 3 may be formed by a deposition process such as a chemical vapor deposition (CVD) method or an atomic layer deposition (ALD) method. However, the method of forming the first encapsulation layer 3 is not limited thereto;

S4, forming a color filter layer 4 on a surface of the first encapsulation layer 3;

S5: depositing a second encapsulation layer 5 on an exposed region of the color filter layer 4, and the second encapsulation layer 5 may be formed by a CVD process, a printing process, or a coating process, but the method of forming the second encapsulation layer 5 is not limited thereto.

As shown in FIG. 5d to FIG. 5g, the step S4 specifically includes:

S41, coating a filter material on a surface of the first encapsulation layer 3, wherein the filter material is an organic material, for example, dichromated gelatin, but the filter material is not limited thereto;

S42: exposing the filter material with a mask plate to obtain the color filter layer 4, wherein a first mask plate is irradiated with a red visible light to expose a position corresponding to the red photoresist layer R, and a second mask plate is irradiated with a green light to expose a position corresponding to the green photoresist layer and a third mask plate is irradiated with a blue light to expose a position corresponding to the blue photoresist layer. Accordingly, the color filter layer 4 is obtained.

In this embodiment, the organic light-emitting layer 2 is encapsulated by using the first encapsulating layer 3 as a substrate of the color filter layer 4 and using the first encapsulation layer 3 and the second encapsulation layer 5 so that the CF substrate is omitted and the whole is display device thickness reduced in order to realize the flexibility The above description is only a specific embodiment of the present application, and it should be noted that for those skilled in the art, a number of improvements and modifications may also be made without departing from the principle of the present application. These improvements and modifications should be regarded as the scope of protection of this application.

What is claimed is:

1. An OLED display device, comprising:
 a substrate, an organic light-emitting layer, a first encapsulation layer, a color filter layer, and a second encapsulation layer;
 wherein the organic light-emitting layer is disposed on the substrate, the first encapsulation layer covers a surface of the organic light-emitting layer, the color filter layer is disposed on the first encapsulation layer, and the second encapsulation layer covers a surface of the color filter layer; and
 wherein the color filter layer comprises multiple photoresists of different colors and the organic light-emitting layer extends across the multiple photoresists of different colors, and wherein the first encapsulation layer comprises a first multilayer encapsulation structure that comprises at least a first buffer layer and the second encapsulation layer comprises a second multilayer encapsulation structure that comprises at least a second buffer layer, the color filter layer being interposed between the two multilayer encapsulation structures and located between the two buffer layers such that at least one of the buffer layers completely covers the color filter layer.

2. The OLED display device according to claim 1, wherein the first encapsulation layer includes at least one first barrier layer, and a material of the first barrier layer is an inorganic material.

3. The OLED display device according to claim 2, wherein a material of the first buffer layer is an organic material, the first barrier layer and the first buffer layer are alternately stacked, and the first barrier layer and the first buffer layer are alternately stacked, and the at least one first barrier layer comprises at least two first barrier layers and the first buffer layer is clamped between two adjacent ones of first barrier layers.

4. The OLED display device according to claim 3, wherein a projection of the organic light-emitting layer on the first barrier layer is located within a projection of the first buffer layer on the first barrier layer.

5. The OLED display device according to claim 2, wherein the second encapsulation layer includes at least one second barrier layer, and a material of the second barrier layer is an inorganic material.

6. The OLED display device according to claim 3, wherein the second encapsulation layer includes at least one second barrier layer, and a material of the second barrier layer is an inorganic material.

7. The OLED display device according to claim 5, wherein a material of the second buffer layer is an organic material, the second barrier layer and the second buffer layer are alternately stacked, and the at least one second barrier layer comprises at least two second barrier layers and the second buffer layer is clamped between two adjacent ones of the second barrier layers.

8. The OLED display device according to claim 6, wherein a material of the second buffer layer is an organic material, the second barrier layer and the second buffer layer are alternately stacked, and the at least one second barrier layer comprises at least two second barrier layers and the second buffer layer is clamped between two adjacent ones of the second barrier layers.

9. The OLED display device according to claim 1, wherein the organic light-emitting layer includes a first electrode, a hole transport layer, a first light-emitting layer, a second light-emitting layer, a third light-emitting layer, an electron transport layer, and a second electrode which are sequentially stacked away from the substrate.

10. The OLED display device according to claim 1, wherein the color filter layer includes multiple photoresist units arranged as matrix, and each of the photoresist units includes a red photoresist, a green photoresist, and a blue photoresist.

11. A manufacturing method for an OLED display device, comprising steps of:
    providing a substrate;
    forming an organic light-emitting layer on the substrate;
    depositing a first encapsulation layer on an exposed region of the substrate and the organic light-emitting layer;
    forming a color filter layer on a surface of the first encapsulation layer; and
    depositing a second encapsulation layer on an exposed region of the color filter layer,
    wherein the color filter layer comprises multiple photoresists of different colors and the organic light-emitting layer extends across the multiple photoresists of different colors, and wherein the first encapsulation layer comprises a first multilayer encapsulation structure that comprises at least a first buffer layer and the second encapsulation layer comprises a second multilayer encapsulation structure that comprises at least a second buffer layer, the color filter layer being interposed between the two multilayer encapsulation structures and located between the two buffer layers such that at least one of the buffer layers completely covers the color filter layer.

12. The manufacturing method for an OLED display device according to claim 11, wherein the step of forming a color filter layer on a surface of the first encapsulation layer comprises steps of:
    coating a filter material on a surface of the first encapsulation layer; and
    exposing the filter material with a mask plate to obtain the color filter layer.

* * * * *